United States Patent [19]

Trout

[11] Patent Number: 4,984,253
[45] Date of Patent: Jan. 8, 1991

[54] APPARATUS AND METHOD FOR PROCESSING SIMULTANEOUS RADIO FREQUENCY SIGNALS

[75] Inventor: Barry D. Trout, Redondo Beach, Calif.

[73] Assignee: Hughes Aircraft Company, Los Angeles, Calif.

[21] Appl. No.: 201,795

[22] Filed: Jun. 3, 1988

[51] Int. Cl.⁵ .................... H04B 1/10; H04L 25/08
[52] U.S. Cl. ............................. 375/99; 455/296
[58] Field of Search ............... 375/14, 15, 94, 95, 375/96, 103; 328/164, 165; 455/296; 364/724; 343/89, 93, 161; 342/91, 92; 358/282; 381/41, 42, 43, 46

[56] References Cited

U.S. PATENT DOCUMENTS

| | | |
|---|---|---|
| 3,877,010 | 4/1975 | Holberg et al. ............... 342/161 |
| 3,877,011 | 4/1975 | Holberg et al. ............... 342/93 |
| 4,070,673 | 1/1978 | Schmidt et al. ............... 342/92 |
| 4,281,318 | 7/1981 | Candy et al. .................. 375/34 |
| 4,302,845 | 11/1981 | McClaughry et al. ........ 375/95 |
| 4,454,511 | 6/1984 | Peters ............................ 342/89 |
| 4,536,764 | 8/1985 | Freeman ........................ 342/91 |
| 4,608,567 | 8/1986 | Bryant et al. ................. 342/91 |
| 4,669,091 | 5/1987 | Nossen .......................... 375/14 |
| 4,672,638 | 6/1987 | Taguchi et al. ............... 375/99 |
| 4,780,720 | 10/1988 | Watts .............................. 342/91 |

Primary Examiner—Dogulas W. Olms
Assistant Examiner—Stephen Chin
Attorney, Agent, or Firm—Leonard A. Alkov; Wanda Denson-Low

[57] ABSTRACT

In a signal processing system, a weighting function is applied to incoming signal pulses in response to a signal edge detector. A weighting function is applied both to the detected large signal pulse and to the time surrounding the signal pulse within a window but at different times so that small signals, if they occur overlapping in time with the leading or trailing edge of the detected large signal, are weighted independently of the large signal. The weighting functions are multiplied with the incoming signals and then sent to conventional signal processing apparatus.

19 Claims, 7 Drawing Sheets

PRIOR ART

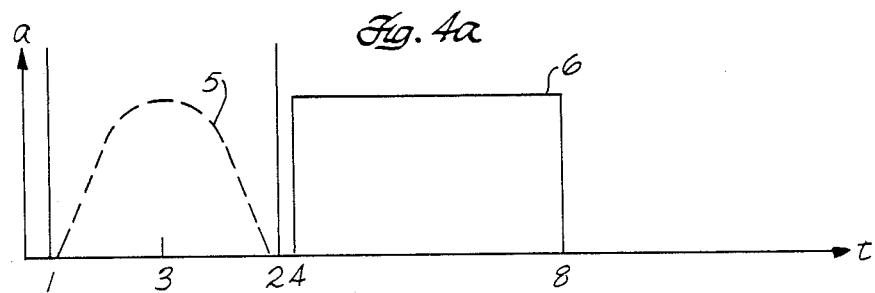
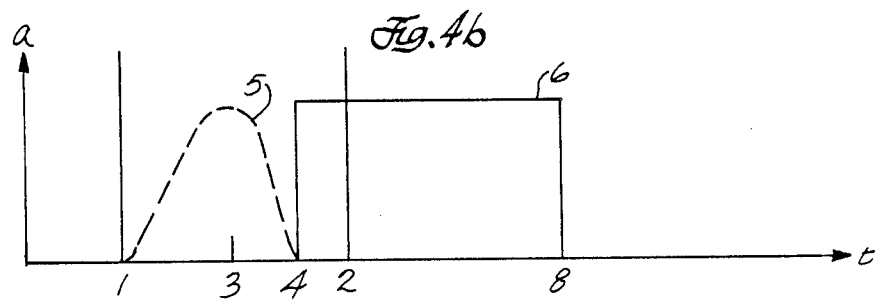
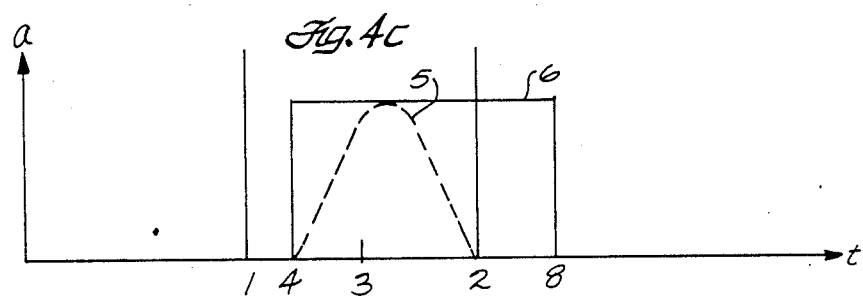
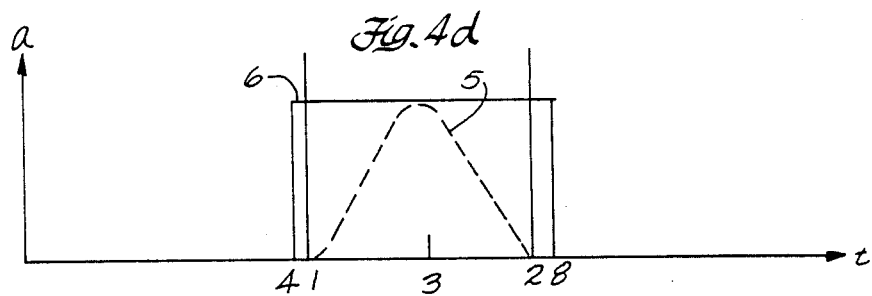

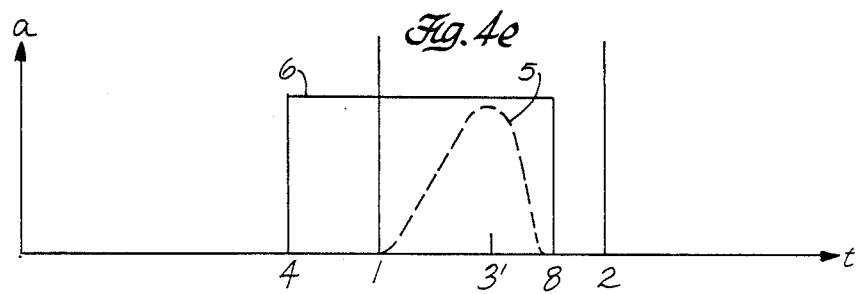
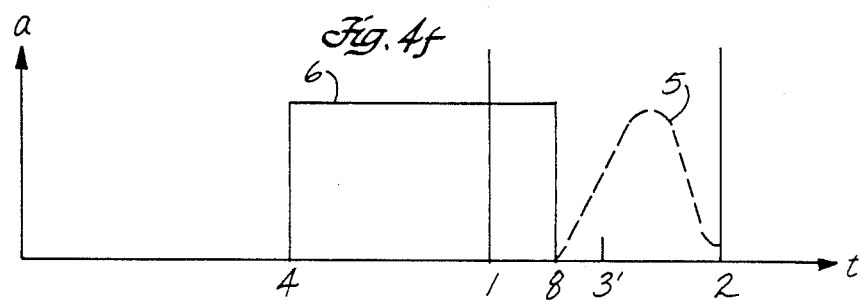
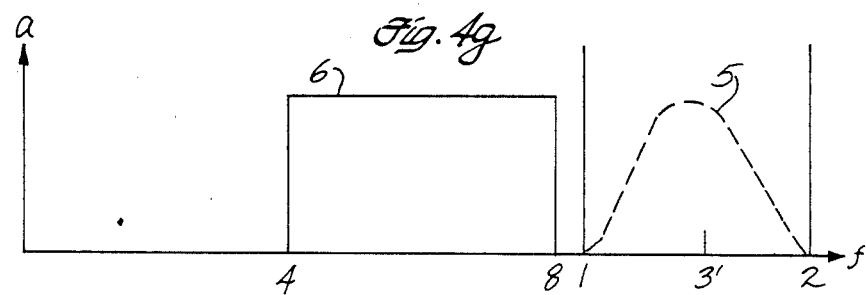

APPARATUS AND METHOD FOR PROCESSING SIMULTANEOUS RADIO FREQUENCY SIGNALS

FIELD OF THE INVENTION

This invention relates to the field of digital signal processing and more particularly to an apparatus and method for adapting weighting functions to enhance the resolution of small radio frequency (RF) signals received overlapping in time with the transient portion of much larger RF signals.

BACKGROUND OF THE INVENTION

Signal processing systems often must measure several parameters of an incoming RF signal. For example, frequency, amplitude, pulse width and time of arrival. However, the signal of interest is often distorted by background noise and other signals. In digital signal processing systems, it has therefore become common to process signals by multiplying them with a weighting function which performs a filtering action on the signal of interest. The weighted signal stands out from the background more clearly so the parameters can then be measured with greater accuracy.

Typically, the weighting function is defined prior to being implemented in a signal processing system and the weighting function coefficients remain constant throughout the use of the system. This method of signal weighting requires only a multiplier and a stored set of weighting coefficients.

In digital signal processing, the sample window is always of finite length. This results in discontinuities at the ends of the sample window with respect to the signal. As a result, sidelobes are generated in the frequency domain. These sidelobes can obscure other signals of smaller amplitude occurring in the window at the same time, as shown in FIG. 1. This phenomenon also occurs in analog signal processing due to the finite bandwidth constraints of analog filters. FIG. 1 is a graphic illustration of a large signal pulse 20 which has been weighted using the constant weighting function system. The signal is plotted in both the time and frequency domain with respect to amplitude. The signal has substantial sidelobes 22 which almost completely obscure the small signal 24.

A more advanced method of processing which has been 20 used in the past to improve the signal to noise ratio (SNR) of a single signal is illustrated in FIGS. 2A-2G. FIG. 2A is a graphical representation of a conventional weighting function 5 as a function of amplitude and time applied to the time interval or window from time 1 to time 2. This time interval is the window of time used for sampling signal parameters. The vertical lines at times 4 and 8 represent the leading and trailing edge of a later occurring incoming signal pulse having an envelope 6.

The more advanced signal weighting commonly requires an edge detector, a weighting function generator, and a multiplier. The edge detector analyzes the incoming signal pulses. When there is no edge, a standard weighting function 5 is applied to the window 6 (FIG. 2A). FIG. 2B represents a later time when the sampling window from time 1 to time 2 has moved in time toward the pulse and partially overlaps the pulse. The weighting function is still applied to the whole window. In FIG. 2C, the sample window overlaps the leading edge of the pulse in time for a significant portion of the sampling window. When the edge detector detects the leading edge 4 of a signal pulse and determines that the sample window 5 occupies a substantial part of the pulse envelope 6, the weighting function is only applied to the pulse envelope as illustrated by FIG. 2C to eliminate the inclusion of noise occurring before the pulse envelope. The weighting function is adapted to fit the signal envelope until the sample window is completely contained within the pulse envelope (FIG. 2D). The signal is then weighted with the constant weighting function matched to the sample window until the sample window overlaps the trailing edge of the pulse in time.

When the edge detector detects the trailing edge 8 of a signal pulse and determines that the sample window 5 overlaps the pulse envelope, the weighting function is only applied to the pulse envelope as illustrated by FIG. 2E to eliminate the inclusion of noise occurring after the pulse envelope. This continues until the sample window is no longer overlapping a substantial part of the pulse envelope 6 after which time, the entire sample window is weighted until the next signal is detected (FIGS. 2F and 2G).

This more advanced method of signal processing increases the signal to noise ratio, however, it does not significantly enhance reception of neighboring small signals. The present invention increases the signal to noise ratio and enhances reception of neighboring small signals. It also significantly reduces the sidelobes thereby reducing interference from neighboring large signals.

SUMMARY OF THE INVENTION

In accordance with the invention, a weighting function is adapted to the signal envelope of received RF pulses processed during sampling windows, according to how much of each sampling window is occupied by the signal envelope. If the signal envelope occupies a greater portion of the window than a threshold value, the weighting function is adapted to fit the envelope. If the signal envelope occupies a lesser portion of the window than the threshold value, the weighting function is adapted to fit the remainder of the window, i.e., the part of the window not occupied by the signal envelope. An edge detector determines how much of the window is occupied by the signal envelope.

Small signals, if they occur either overlapping with the leading edge of a large pulse or overlapping with the trailing edge of a large pulse, are thereby weighted independently of the large signal. The sample window is designed to be no longer than the shortest 20 pulse of interest. The weighting functions are multiplied with the incoming signals and then sent to conventional signal processing apparatus.

The present invention is particularly well suited to electronic warfare applications. In electronic warfare, it is important to detect and measure small signals of unknown but diverse frequencies that may be overlapping in time with the leading or trailing edge of a large signal. The present invention allows the measurement of small signals which otherwise might not be detectable.

BRIEF DESCRIPTION OF THE DRAWINGS

FIG. 4A is a graphical representation of a conventional weighting function as applied by the present invention to a sample window on a time line which includes a large signal envelope;

FIG. 4B is a graphical representation of a conventional weighting function as contracted by the present invention when the leading edge of a large FIG. 4C is a graphical representation of a conventional weighting function as adapted by the present invention after a large signal envelope fills more than the minimum effective window width;

FIG. 4D is a graphical representation of a conventional weighting function as expanded by the present invention when a large signal envelope fills the entire sample window;

FIG. 4E is a graphical representation of a conventional weighting function as contracted by the present invention when the trailing edge of a large signal envelope has entered the sample window;

FIG. 4F is a graphical representation of a conventional weighting function as adapted by the present invention after a large signal envelope fills less than the minimum effective window width;

FIG. 4G is a graphical representation of a conventional weighting function as adapted by the present invention after the large signal envelope has left the window.

DETAILED DESCRIPTION

A preferred embodiment of the present invention is integrated into a digital electronic warfare signal receiving and processing system. However, the invention can be applied to radar, sonar, telecommunications and any other field in which signals of diverse amplitudes which overlap in time must be analyzed.

Figure 3:
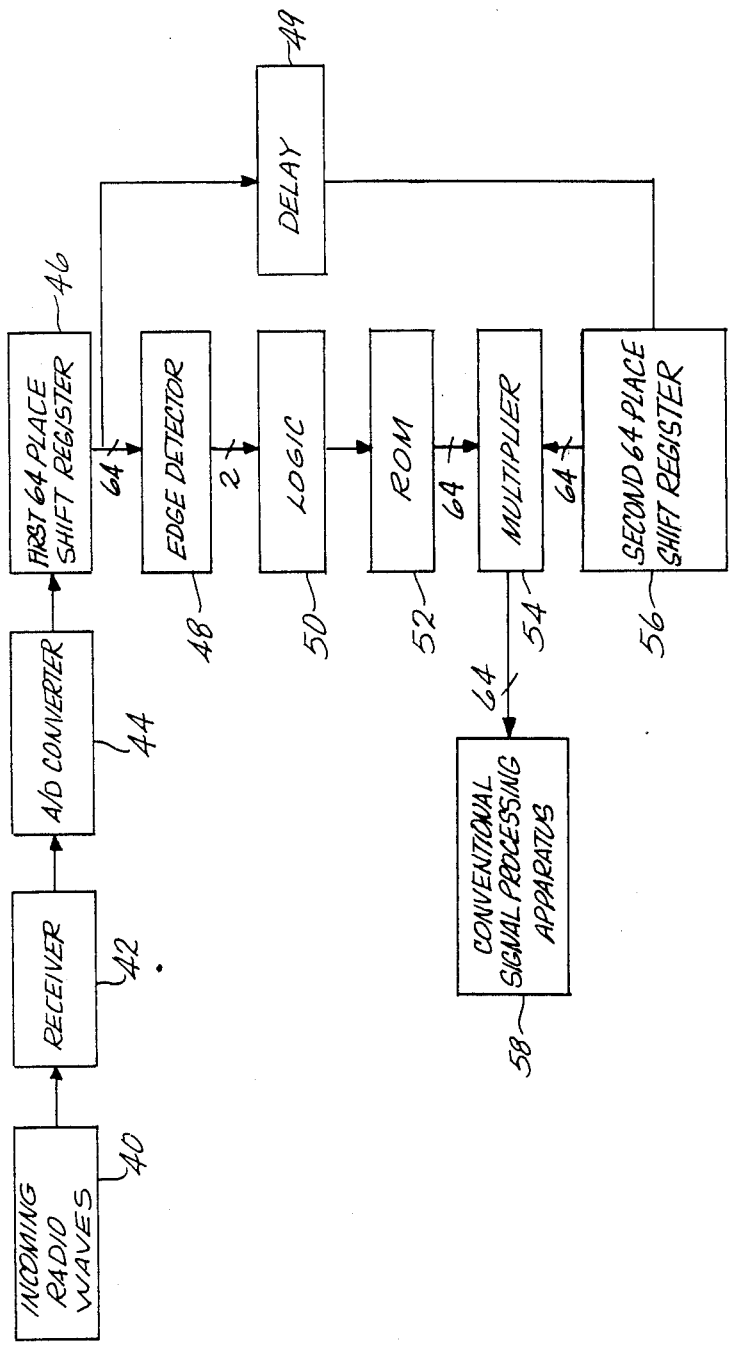
FIG. 3 is a block diagram of the present invention in a signal processing environment.

As shown in the block diagram of FIG. 3, radio waves 40 are intercepted by a receiver 42 in the form of radio frequency (RF) signal pulses. The receiver converts the electromagnetic signal pulses to an electrical voltage signal as is well known in the art. The voltage signal is then fed into an analog to digital (A/D) converter 44. The A/D converter samples the incoming voltage signals at a particular frequency and digitizes the voltage amplitude of each sample. The stream of digitized samples is fed into a first shift register 46 that has a sixty-four sample capacity.

The shift register sends the sixty-four digitized samples on sixty-four parallel lines to an edge detector 48 which analyzes the samples within each group of sixty-four to determine whether a leading edge or a trailing edge exists within the sample window. If a leading edge or a trailing edge exists within the sample window, the edge detector determines which sample is closest to the leading edge or trailing edge and declares that sample to be the transition edge sample. The edge detector also determines whether the transition edge sample corresponds to a leading edge or a trailing edge.

The edge detection function can be performed in a number of ways well known in the art. As an example, an edge detector can be designed to declare a transition edge, either a leading edge or a trailing edge, when a signal amplitude crosses a predetermined threshold. The type of edge, leading or trailing, can then be determined by testing whether the signal amplitude is increasing or decreasing. An algorithm in the form of a subroutine which can be used for an edge detector is attached as Exhibit A. More sophisticated edge detection algorithms can be developed. This particular one was selected for illustrative purposes due to its simplicity.

When the edge detector senses an edge, it signals weighting function selector logic 50 using two lines. One line indicates which sample corresponds to the edge and the other indicates whether the edge is a leading edge or a trailing edge. With this information, the logic selects a weighting function from the many weighting functions stored in a read only memory (ROM) 52. The stored weighting functions are conventional weighting functions known in the art, for example, Hamming functions, Hanning functions, or Blackman functions. However, they have been expanded or 20 contracted in width to match the location of the signal edge. The adaptation of the weighting functions is described below in more detail. A subroutine for calculating the weighting function coefficients stored in the ROM has been attached as Exhibit B.

The first sixty-four place shift register 46 also sends the sixty-four digitized samples to a delay 49. The delay compensates for the time necessary to perform the edge detection algorithm and select the proper ROM coefficients. The data is then sent to a second sixty-four place shift register for further processing.

The weighting functions from the ROM 52 are sent to a multiplier 54 on sixty-four parallel lines where they are multiplied with the sixty-four digitized samples stored in the second sixty-four place shift register 56. The digitized, weighted signals are then sent on to conventional signal processing apparatus 56 where the signal parameters can be separated, measured, analyzed, and displayed in any number of convenient well known forms.

When the weighted signals are analyzed in the conventional signal processing apparatus, they are analyzed in groups of samples called windows. In the present exemplary embodiment, each window is made up of sixty-four samples. The shift registers store successive overlapping windows which advance, one sample at a time. For example, if sixty-four successive samples are fed into the shift register from left to right and the samples are labeled one through sixty-four, where 1 is the earliest sample in time at the right end of the shift register and sixty-four is the most recent sample in time at the left end of the shift register, the shift register will send samples one through sixty-four to the edge detector. These same sixty-four samples, properly delayed and aligned in time with the coefficient ROM will constitute the first window of data. The adaptive weighting apparatus will then shift each sample one place to the right. The next window will therefore have samples labeled two through sixty-five. Sample one is shifted out and sample sixty-five is shifted in. The third window will have samples three through sixty-six, and so on.

Of course, the windows could consist of more or fewer than sixty-four samples and successive windows could be processed with less overlap between windows, e g., a fifty-six sample overlap as opposed to the sixty-three sample overlap described here.

The weighting functions are selected by the logic 50 based on the location of the edge in the window as determined by the edge detector 48. In the described embodiment, the window consists of sixty-four samples, so the ROM is a 128×sixty-four array. The places in the rows correspond to the samples in the window, and the columns correspond to possible edge locations. Each column of sixty-four is a set of sixty-four weighting coefficients, one coefficient for each of the sixty-four samples in the window. It requires a complete set of sixty-four samples to form a single weighting function for the sixty-four sample window. There are 128 columns and therefore 128 weighting functions, one weighting function for each of the sixty-four possible leading edge locations and one weighting function for each of the sixty-four possible trailing edge locations. For example, if a leading edge is at sample point twenty-eight in the window, column twenty-eight is selected from the ROM and each of its sixty-four coefficients are multiplied with its corresponding sample.

The 128 sets of weighting functions are all the same weighting function expanded or contracted in width. They all have the same amplitude range, but they differ in width. As explained in more detail below, the weighting function is expanded, contracted, and shifted depending on the edge location in the window. The stored weighting functions make up all the expanded, contracted, and shifted adaptations necessary to implement the invention.

A ROM is used for speed but the weighting functions could be generated on demand or stored in some other type of device. Also, a sixty-four by sixty-four array could be used instead. Using the same weighting function for leading edges as for trailing edges, there would be one column for weighting functions for each possible leading edge location and the same columns would be used for each possible trailing edge location. Thus, only sixty-four columns would be necessary in total. If the edge were a leading edge, the weighting function would go directly to the multipliers, but if it were a trailing edge, it could be modified, for example, by reversing the order of the coefficients, before being sent to the multipliers.

FIGS. 4A–4G show how the present invention, in a preferred embodiment, adapts and applies weighting functions. The window stretches from time 1 to time 2 and consists of sixty-four samples plotted on the horizontal time axis. The window moves from left to right on the time axis so the sample at time 2 was received first, and the sample at time 1 is the most recent. The amount of multiplication provided by each weighting function is indicated on the vertical amplitude axis.

The distances from time 1 to time 3 and time 3' to time 2 represent the minimum effective window widths. A minimum effective window width is necessary because, for some of the samples in the window, the weighting function will be zero. For example, in FIG. 4C the samples between time 1 and time 4 will be multiplied by zero because the amplitude of the weighting function there is zero. Similarly, in FIG. 4E, the samples between time 8 and time 2 will be zeroed. While the actual window width is still the interval from time 1 to time 2, in effect, the width of the window is reduced to the interval between time 4 and time 2, and the interval between time 1 and time 8, respectively. The other samples have been multiplied away. The signal processing apparatus therefore will have a smaller data set with which to analyze the signals. However, the smaller data set will be less corrupted by a large interfering signal. Beyond a certain point, reduction of the effective window width causes too many data points to be zeroed and there is insufficient data to perform accurate analysis of the data. This point determines the minimum size of the effective window width. In FIGS. 4A through 4C, the minimum size is the number of samples received between time 1 and time 3. In FIGS. 4E through 4G, the minimum size is the number of samples received between time 31 and time 2.

As shown in FIG. 4A, when the signal pulse envelope 6 is not in the window, the logic selects a weighting function 5 that is spread evenly over the entire window. As the window moves toward the pulse envelope, first, a leading edge 4 and then, a trailing edge 8 will enter the window for each pulse. As an edge is detected, the weighting function is adapted to fit the edge's location in the window. The weighting function used will vary depending on the location of the edges, only one of which may be in the window at a time.

FIG. 4B shows the weighting function 5 applied by the present invention when a leading edge enters the window. Samples received before the leading edge was received are weighted positively. Samples received after the leading edge are zeroed. This weighting function is adapted to fit the part of the window not occupied by the large signal pulse envelope 6.

Figure 2A:
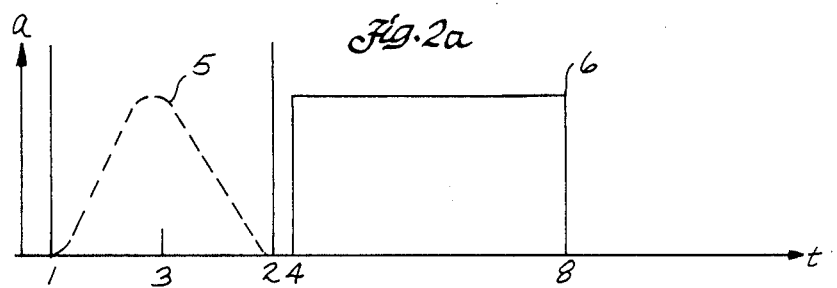
FIG. 2A is a graphical representation of a conventional weighting function as applied to a sample window in the prior art on a time line which includes a signal envelope.
Figure 2B:
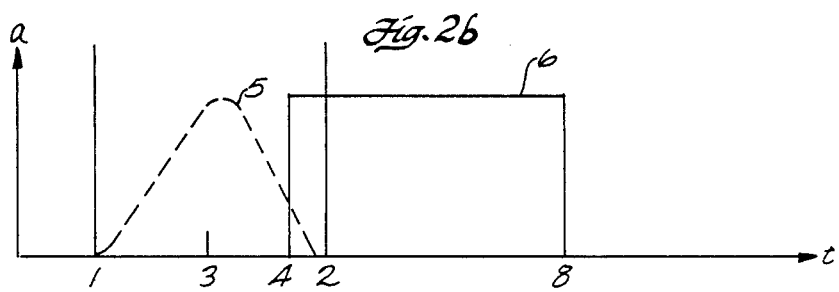
FIG. 2B is a graphical representation of the same weighting function as applied in the prior art when the sample window; partially overlaps the signal envelope.
Figure 2C:
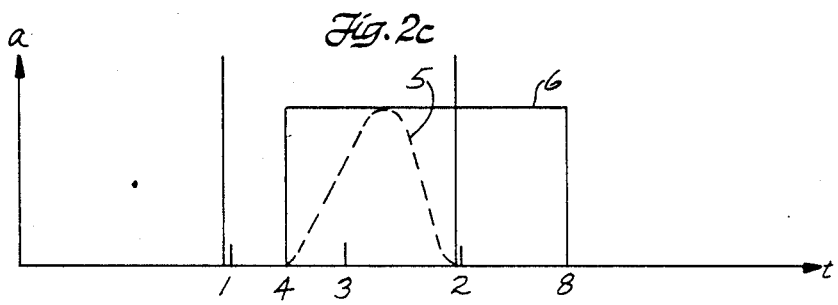
FIG. 2C is a graphical representation of the same weighting function as adapted in the prior art to match the signal envelope.
Figure 2D:
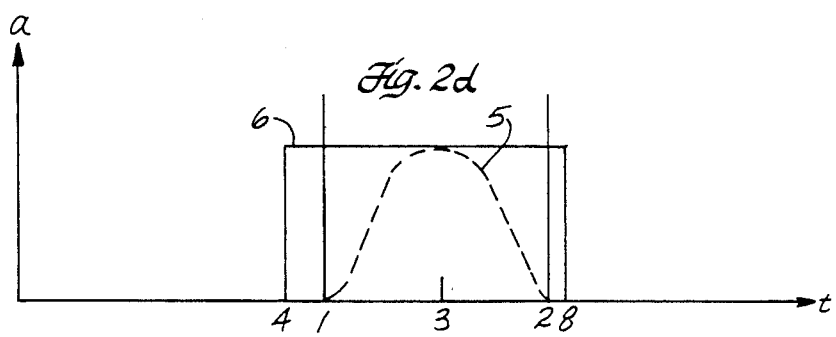
FIG. 2D is a graphical representation of the same weighting function as expanded in the prior art when the sample window, is completely overlapped by the signal envelope.
Figure 2E:
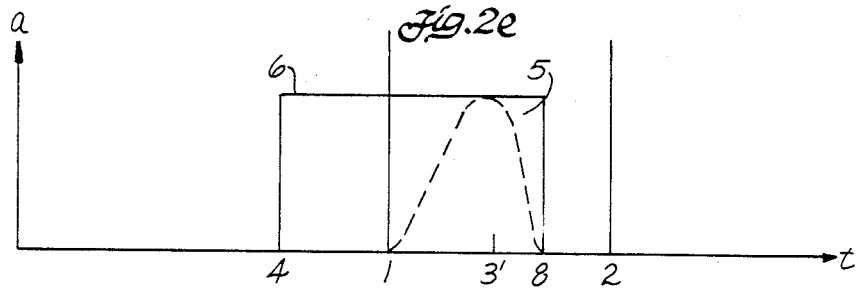
FIG. 2E is a graphical representation of the same weighting function as adapted in the prior art to match the signal envelope.
Figure 2F:
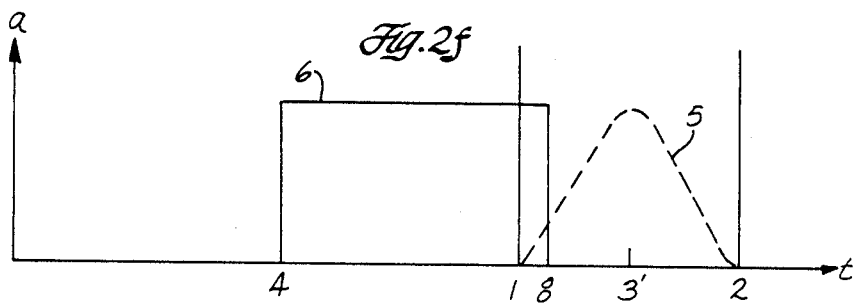
FIG. 2F is a graphical representation of the same weighting function as adapted in the prior art when a signal trailing edge is near the end of the sample window.
Figure 2G:
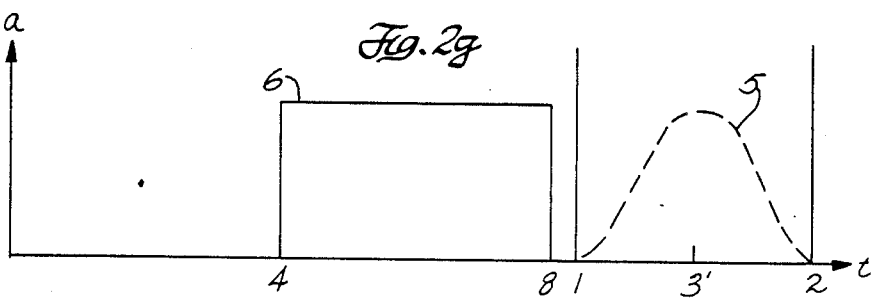
FIG. 2G is a graphical representation of the same weighting function as adapted in the prior art after a signal trailing edge has departed the sample window.

In the more advanced method of processing signals in the prior art, weighting functions are applied either to the whole window (FIGS. 2A, 2B, 2F, and 2G) or to the signal envelope (FIGS. 2C to 2E). This increases the signal to noise ratio (SNR) by removing samples which consist only of noise without any signal. However, if, in the time domain, there is a small signal near the large signal, it will be zeroed by the weighting functions and will not be detected.

The present invention, by weighting samples taken before the leading edge was received boosts the small signal, if one exists, so that it can also be measured in the conventional signal processing apparatus. As the window moves toward the pulse envelope, the weighting function is contracted to fit the part of the window remaining between the leading edge 4 and time 1 of the window (FIG. 4B).

The invention continues to weight the samples outside the leading edge of the pulse envelope until point 3 reaches the leading edge. If the invention continued to weight the samples before the leading edge, the effective window width from point 1 to point 4 would be less than the minimum effective window width from point 1 to point 3.

Therefore, after point 3 passes the leading edge 4, the weighting function 5 is switched to the window space following the leading edge (FIG. 4C). As a result, the large signal envelope in the window is weighted and signals in the remainder of the window are zeroed. As the window advances, the large signal envelope occupies more of the window. The weighting function is expanded to fill this space until the entire window is within the large signal envelope. The entire window is then weighted (FIG. 4D).

After the leading edge exits the window, the trailing edge 8 enters (FIG. 4E). The window width from 1 to 2 is selected to be longer than the shortest anticipated pulse envelope of the signals to be analyzed. Therefore, the trailing edge 8 is never in the window at the same time as the leading edge 4. As the trailing edge enters the window, the weighting function is contracted so that only the large signal envelope is weighted.

The weighting function continues to contract until the trailing edge passes the minimum window width point 3'. The weighting function is then shifted (FIG. 4F). The minimum effective window width parameter in FIGS. 4E through 4G has been renumbered from 3 to 3' because the minimum window width refers to the minimum width acceptable before the shift from zeroing the data from the large signal pulse envelope to zeroing the data from outside the large pulse envelope occurs. Thus, the point at which the switch occurs will typically be different for the leading and trailing edges. For example, if the minimum window width were twenty with a sample window width of sixty-four, then for the leading edge, point 3 would be at twenty while for the trailing edge, point 3' would be at forty-four. In the present embodiment, however, the minimum number of nonzero samples has been chosen to be one half the total or thirty-two samples, so point 3 and 3' are concurrent.

While in the prior art the weighting function would shift to the whole window from time 1 to time 2 after the trailing edge passes the threshold point 3' (FIG. 2F), the present invention weights only the samples received after the trailing edge 8, while zeroing the large signal envelope. This represses the large signal sidelobes and allows smaller signals, if any, received near the trailing edge, to be detected and measured. As the window advances, the weighting function is expanded, continuing to weight all of the samples following the trailing edge until the trailing edge exits the window. After the trailing edge exits the window, the weighting function is again applied to the entire window until a new edge is detected (FIG. 4G).

In summary, the weighting function expands and contracts between the full window width and the user selected minimum window width. With reference to FIGS. 4A to 4G, the width of the weighting function matches the width of the sample window when the pulse envelope lies totally outside the window. As the leading edge of the pulse envelope enters the window, the weighting function contracts in the portion of the window occupied by the pulse envelope until the weighting function is contracted to the minimum window width. Then, the weighting function switches to occupy the same portion of the window as the pulse envelope and expands with the pulse envelope until it occupies the entire window. As the trailing edge of the pulse envelope enters the window, the weighting function, occupying the same portion of the window as the pulse envelope, contracts until the weighting function is contracted to the minimum window width. Thereupon, the weighting function again switches to the portion of the window unoccupied by the pulse envelope and expands until the pulse envelope leaves the window entirely.

The preferred embodiment is adapted specifically for electronic warfare. In a specific example, the windows contain sixty-four samples each, and sampling is done at 1,280 MHz, so the window is 50 nanoseconds long. The signal processing system must handle signal pulses no shorter than 100 nanoseconds long. The selected minimum effective window length is one half the actual window length, or 32 samples and 25 nanoseconds long.

Figure 1:
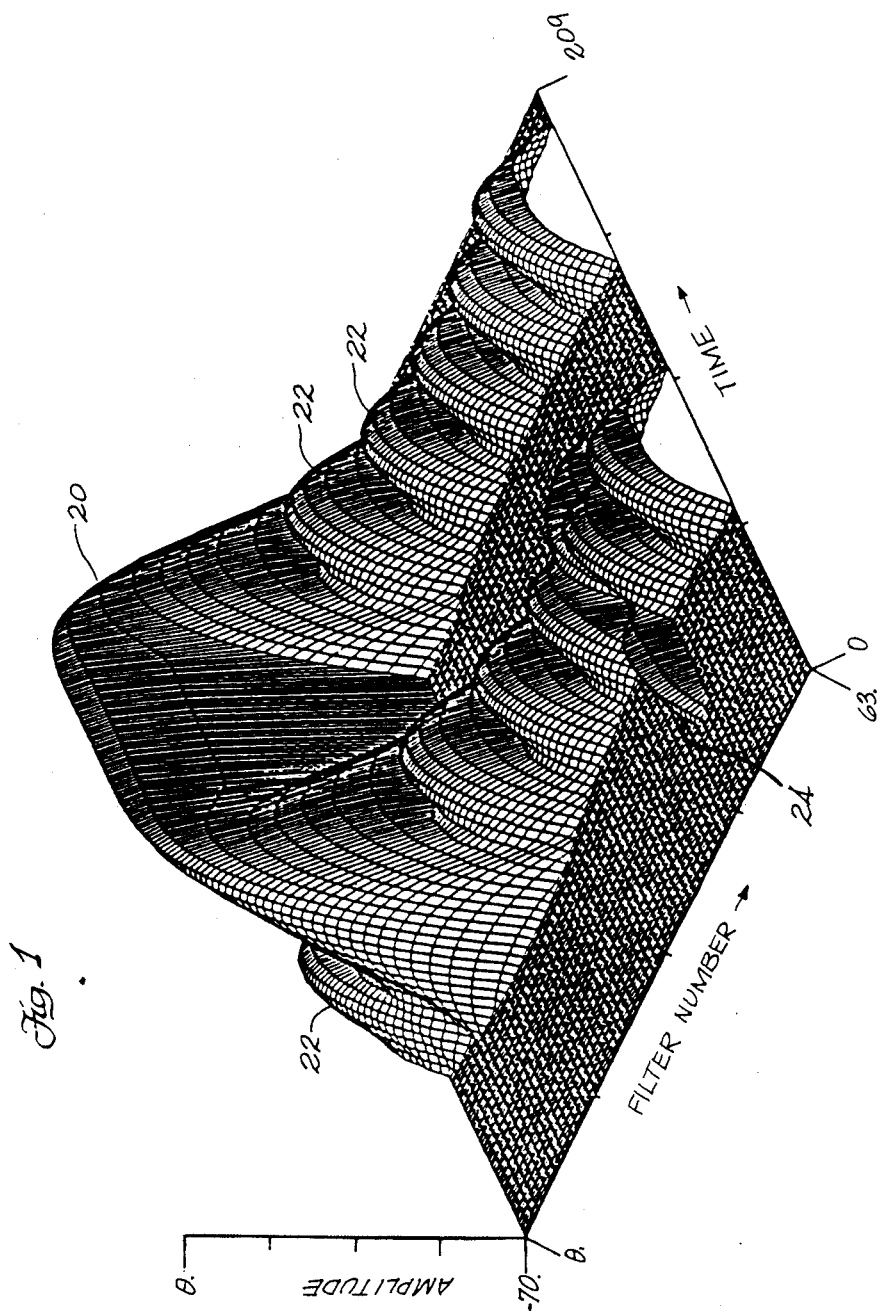
FIG. 1 is a graphical representation of a large signal and a small signal which overlaps the transient portion of the large signal in time. This is plotted as a function of frequency, time, and amplitude as amplified using the prior art's constant weighting. This figure shows the sidelobes of the large signal obscuring and distorting the small signal.
Figure 5:
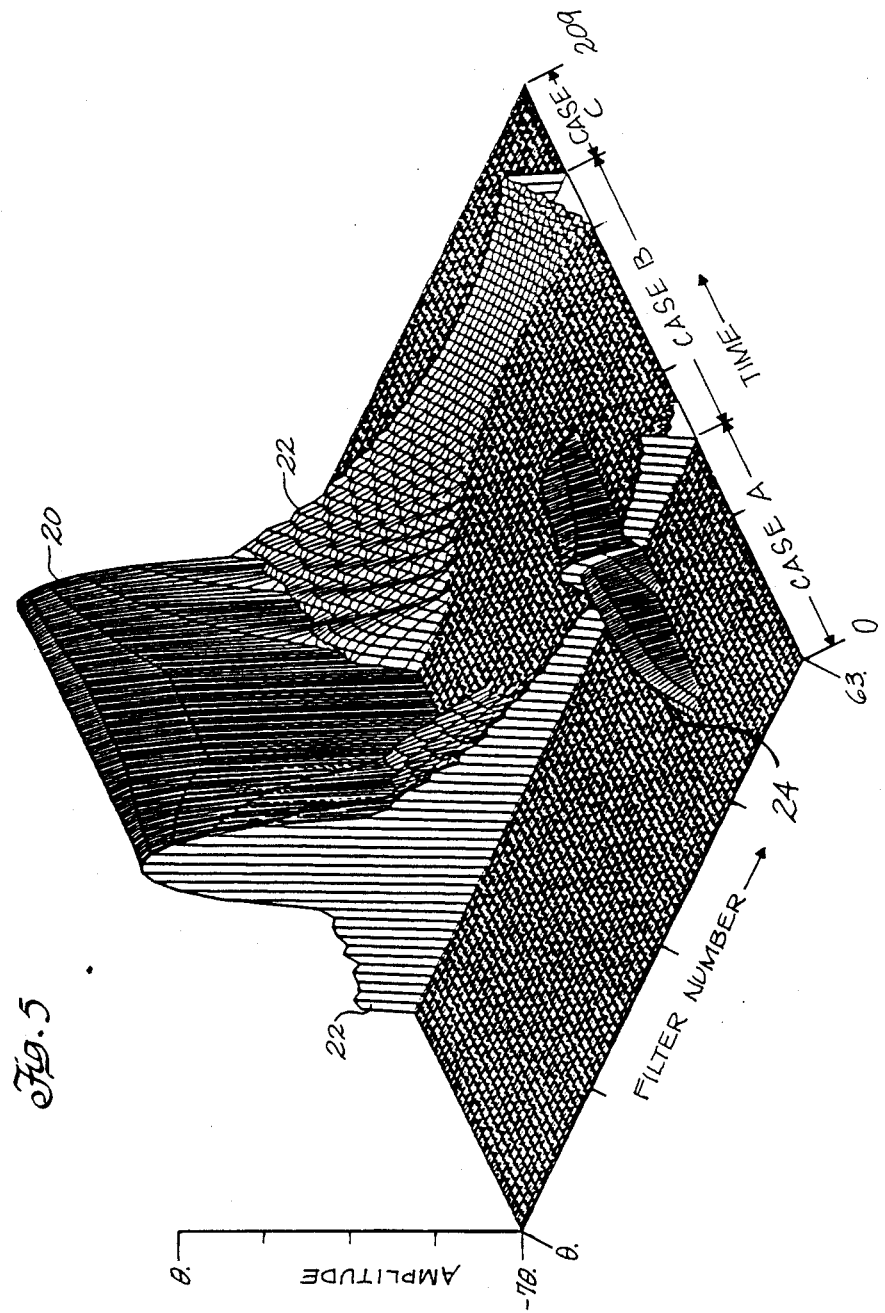
FIG. 5 is a graphical representation of a small signal overlapping with the leading edge of a large signal as a function of frequency, time, and amplitude as obtained by the adaptive weighting of the present invention.

FIG. 5 demonstrates the substantial improvement in small signal detection achieved by the present invention as compared to the prior art constant weighting approach (FIG. 1). The same two signals, overlapping in time and close in frequency, but very different in amplitude have been plotted as a function of time, frequency, and amplitude in both figures. In FIG. 1, the smaller signal 24 is almost entirely obscured by the sidelobes 22 of the large signal 20. In FIG. 5, the sidelobes 22 are greatly reduced and the small signal 24 is readily apparent. On the time axis, the region for Case A corresponds to when the window space before the leading edge is weighted (FIGS. 4A and 4B). Case B corresponds to when the large signal envelope is weighted (FIGS. 4C through 4E). Case C corresponds to when the window space after the trailing edge is weighted (FIGS. 4F through 4G).

FIG. 1 also shows how the sidelobes become superimposed on the small signal distorting its basic shape. With the present invention, as shown in FIG. 5, the long, large sidelobes have much less effect on the small signal. Therefore, the small signal's parameters can be determined with greater accuracy. A subroutine which executes the adaptive weighting of the present invention is attached as Exhibit C.

The present invention can be simplified by reducing the number of sets of weighting coefficients applied to the samples. For example, assuming the same sixty-four point sample window, the edge detector could be designed to detect the edge to within a region of four sample points. The edge could then lie in only one of sixteen possible four sample regions. The array of weighting functions could then be as small as a sixteen×sixty-four array. There would be sixteen columns, one for each possible edge location, and sixty-four weighting multipliers, one to be multiplied by each of the sixty-four data samples in the sample window. This example would also require the use of the reversal technique described earlier to account for the leading and trailing edge cases. This type of simplification allows the invention to operate much faster, an advantage with high sampling rates. The reduced resolution caused by using fewer sets of weighting functions would not be significant in most applications.

While this description assumes digital signal processing, the present invention may also be worked using an analog system.

A large number of other variations are also possible without departing from the spirit or scope of the present invention. It is not intended to abandon these variations by describing only the embodiments described here.

```
C**********************************************************************
C
      SUBROUTINE EDGE (REAL,IMAG,NP,THRESH,NT,FIRST,LAST)
C
C     THIS SUBROUTINE COMPUTES THE NUMBER OF POINTS
C     CORRESPONDING TO THE TRUNCATED SIGNAL AS WELL
C     AS THE FIRST AND LAST POINTS OF THE TRUNCATED
C     SIGNAL WITHIN THE SAMPLE BASED ON THE SIGNAL'S
C     MAGNITUDE
C
C     REAL(*) = THE REAL SIGNAL COMPONENTS
C
C     IMAG(*) = THE IMAGINARY SIGNAL COMPONENTS
C
C     NP = THE NUMBER OF SAMPLE POINTS
C
C     THRESH = THE THRESHOLD LEVEL
C
C     NT = THE NUMBER OF POINTS CORRESPONDING TO THE SIGNAL
C
C     FIRST = THE FIRST POINT CORRESPONDING TO THE SIGNAL
C
C     LAST = THE LAST POINT CORRESPONDING TO THE SIGNAL
C
      INTEGER FIRST
      REAL IMAG
C
      DIMENSION REAL(256),IMAG(256)
C
      FIRST = 0
      LAST = 0
      NT = 0
C
      DO 10 I = 1,NP
      TEST = SQRT(REAL(I)**2 + IMAG(I)**2)
      IF (TEST.GE.THRESH) THEN
      NT = NT + 1
      IF (FIRST.EQ.0) FIRST = I
      END IF
      IF (NT.GT.0) LAST = FIRST + NT - 1
   10 CONTINUE
C
      RETURN
      END
C
C**********************************************************************
```

EXHIBIT A

```
C**********************************************************************
C
      SUBROUTINE GENROM (NP,NV,ROM)
C
C     THIS SUBROUTINE GENERATES THE ROM TABLE CONTAINING
C     THE COEFFICIENTS FOR THE ADAPTIVE WEIGHTING FILTER
C
C     THIS VERSION COMPENSATES FOR THE REDUCED ENERGY IN
C     A SHORTER WEIGHTING FUNCTION BY MULTIPLYING COEFFICIENTS
C     CORRESPONDING TO WEIGHTING FUNCTIONS SHORTER THAT THE
C     FULL WEIGHTING FUNCTION SIZE BY CONSTANT INVERSELY
C     PROPORTIONAL TO THE WIDTH OF THE WEIGHTING FUNCTION.
C
C     THIS VERSION MAXIMIZES THE NUMBER OF NONZERO WEIGHTING
C     COEFFICIENTS CORRESPONDING TO THE SMALL SIGNAL. AN
C     ALTERNATIVE APPROACH IS TO MAXIMIZE THE NUMBER OF NONZERO
C     WEIGHTING COEFFICIENTS CORRESPONDING TO THE LARGE SIGNAL
C     DEPENDING ON THE APPLICATION. A 4*NP BY NP ROM COULD BE
C     USED TO IMPLEMENT BOTH VERSIONS AT THE SAME TIME REQUIRING
C     ONLY SMALL CHANGES IN THE LOGIC TO SELECT WHICH SET OF
C     COEFFICIENTS TO USE BASED ON THE RELATIVE IMPORTANCE OF
C     SMALL SIGNALS VERSUS LARGE SIGNALS.
C
C============= PARAMETER VALUES =============
C
C     NP = NUMBER OF POINTS IN THE SAMPLE WINDOW
```

```
C
C    NV = THE MINIMUM WEIGHTING FUNCTION LENGTH
C
C    ROM = ARRAY CONTAINING THE ADAPTIVE WEIGHTING FILTER COEFFS.
C
C============ BEGIN SUBROUTINE =============
C
     INTEGER SP
C
     DIMENSION ROM(512,256)
C
C    FIND THE COHERENT GAIN VALUE
C
     CG = 0.0
     DO 10 I = 1,NP
     CG = CG + BLKMAN (I,NP)
10   CONTINUE
C
C    GENERATE THE ROM TABLE
C
C    LEADING EDGE OF LARGE PULSE CASE
C
     DO 20 SP = 1,NP
C
     IF (SP.LE.NV) THEN
     NT = NP-SP+1
     DO 30 I = 1,NP
     IF (I.LT.SP) ROM(SP,I) = 0.0
     IF (I.GE.SP) ROM(SP,I) = (FLOAT(NP)/NT) *
    *     (1.0/CG) * BLKMAN (I-SP+1,NT)
30   CONTINUE
     END IF
C
     IF (SP.GT.NV) THEN
     NT = SP-1
     DO 40 I = 1,NP
     IF (I.LT.SP) ROM(SP,I) = (FLOAT(NP)/NT) *
    *     (1.0/CG) * BLKMAN (I,NT)
     IF (I.GE.SP) ROM(SP,I) = 0.0
40   CONTINUE
     END IF
C
20   CONTINUE
C
C    TRAILING EDGE OF LARGE PULSE CASE
C
     DO 50 SP = NP,1,-1
C
     IF (SP.GT.(NP-NV+1)) THEN
     NT = SP-1
     DO 60 I = 1,NP
     IF (I.LT.SP) ROM(SP+NP,I) = (FLOAT(NP)/NT) *
    *     (1.0/CG) * BLKMAN (I,NT)
     IF (I.GE.SP) ROM(SP+NP,I) = 0.0
60   CONTINUE
     END IF
C
     IF (SP.LE.(NP-NV+1)) THEN
     NT = NP-SP+1
     DO 70 I = 1,NP
     IF (I.LT.SP) ROM(SP+NP,I) = 0.0
     IF (I.GE.SP) ROM(SP+NP,I) = (FLOAT(NP)/NT) *
    *     (1.0/CG) * BLKMAN (I-SP+1,NT)
70   CONTINUE
     END IF
C
50   CONTINUE
C
     RETURN
     END
C
C***********************************************************************
C
     FUNCTION BLKMAN (N,NP)
C
C    THIS FUNCTION RETURNS THE VALUE OF THE NTH
C    COEFFICIENT OF A BLACKMAN WEIGHTING FUNCTION
C
C============ PARAMETER VALUES =============
C
C    N = THE NUMBER OF THE DESIRED COEFFICIENT FOR THE
C    WEIGHTING FUNCTION
```

```
C
C    NP = THE NUMBER OF POINTS IN THE WEIGHTING FUNCTION
C
C============== BEGIN FUNCTION ===============
C
C    DEFINE CONSTANTS
C
     PI = 3.1415926
C
     A0 = 0.42
     A1 = 0.50
     A2 = 0.08
C
     BLKMAN = A0 - A1*COS(2.0*PI*(N-0.5)/NP) +
     A2*COS(4.0*PI*(N-0.5)/NP)
C
     END
C
C*********************************************************
```

EXHIBIT B

```
C*********************************************************
C
     SUBROUTINE LOGIC (FIRST,LAST,NP,ROMNUM)
C
C    THIS SUBROUTINE SELECTS THE PROPER WEIGHTING FUNCTION
C    TO USE FROM THE ROM CONTAINING ALL THE WEIGHTING FUNCTIONS
C    REQUIRED BY THE ADAPTIVE WEIGHTING FILTER. ROMNUM REFERS
C    TO THE NUMBER OF THE WEIGHTING FUNCTION TO BE USED FROM THE
C    ROM TABLE.
C
     INTEGER FIRST,LAST,ROMNUM
C
C    NO PULSE ABOVE THRESHOLD
C
     IF (FIRST.EQ.0) THEN
     ROMNUM = 1
     END IF
C
C    LEADING EDGE OF LARGE PULSE
C
     IF ((FIRST.GT.1).AND.(LAST.EQ.NP)) THEN
     ROMNUM = FIRST
     END IF
C
C    STEADY STATE CASE FOR LARGE PULSE
C
     IF ((FIRST.EQ.1).AND.(LAST.EQ.NP)) THEN
     ROMNUM = NP+1
     END IF
C
C    TRAILING EDGE OF LARGE PULSE
C
     IF ((FIRST.EQ.1).AND.(LAST.LT.NP)) THEN
     ROMNUM = LAST+NP+1
     END IF
C
C    END SUBROUTINE
C
     END
C
C*********************************************************
C
     SUBROUTINE TDPRO2 (NP,REAL,IMAG)
C
C    THIS SUBROUTINE IMPLEMENTS THE ADAPTIVE WEIGHTING
C    FUNCTION.
C
     REAL REAL(256),IMAG(256),ROM(512,256)
     INTEGER FIRST,ROMNUM
C
     COMMON /TMPAR/ TDP,THRESH,NV,ROM
C
C    FIND THE LEADING OR TRAILING EDGE
C
     CALL EDGE (REAL,IMAG,NP,THRESH,NT,FIRST,LAST)
C
C    SELECT THE ROM COEFFICIENT COLUMN
C
```

```
       CALL LOGIC (FIRST,LAST,NP,ROMNUM)
C
C      FILTER THE DATA
C
       DO 10 I = 1,NP
       REAL(I) = ROM(ROMNUM,I) * REAL(I)
       IMAG(I) = ROM(ROMNUM,I) * IMAG(I)
10     CONTINUE
C
       RETURN
       END
C
C*************************************************************************
```

EXHIBIT C

What is claimed is:

1. In a signal processing system an apparatus for applying weighting functions to signals within a sliding time window comprising:
   an edge detector for determining when an edge of an individual pulse in a pulse train of a detected signal occurs;
   a source of weighting functions;
   means for selecting a weighting function from the source based on the location of a leading or trailing edge of said individual pulse in said detected signal so that pulses outside the envelope of said pulse are weighted to the substantial exclusion of the envelope of said pulse for at least sometime during which the envelope of said pulse is within the sliding time window; and
   means for applying the selected weighting function to the signal.

2. The apparatus of claim 1 also comprising means for delaying the signal to which the weighting functions are applied until a weighting function has been selected.

3. The apparatus of claim 1 in which the source of weighting functions is a memory array.

4. The apparatus of claim 3 in which the memory array is at least two dimensional, one dimension corresponding to the edge location and the other dimension corresponding to coefficients of the different weighting functions.

5. The apparatus of claim 1 in which the edge detector distinguishes between leading and trailing edges and the means for selecting a weighting function, selects a weighting function in accordance with that distinction.

6. In a signal processing system an apparatus for applying weighting functions to signals within a window comprising:
   an edge detector for determining the location of an edge of a detected pulse within a window;
   a source of weighting functions;
   means for selecting a weighting function from the source based on the location of the pulse edge so that the window space which substantially excludes the detected pulse is weighted more than the window space which substantially includes the detected pulse for at least some times; and
   means for applying the selected weighting function to signals within a window.

7. The apparatus of claim 6 in which the pulses have been converted to digital data samples and the elements of the apparatus operate digitally.

8. The apparatus of claim 6 in which the source of weighting functions is a memory array.

9. The apparatus of claim 8 in which the memory array ia at least two dimensional, one dimension corresponding to the edge location and the other dimension corresponding to coefficients of the weighting function.

10. The apparatus of claim 8 in which the window comprises a plurality of data samples and the array of weighting functions includes at least as many weighting functions, as there are data samples at least one for each possible edge location in the window and each weighting function includes at least as many coefficients as there are data samples, at least one for each data sample in the window.

11. The apparatus of claim 6 also comprising means for delaying the signals to which the weighting functions are applied until a weighting function is selected.

12. The apparatus of claim 6 in which the signals are radio waves.

13. The apparatus of claim 12 in which the source of weighting functions is an at least two-dimensional random access memory array in which one dimension corresponds to coefficients to be multiplied with individual samples and the other dimension corresponds to edge locations.

14. An apparatus for processing radio frequency signals comprising:
   means for intercepting a radio frequency signal;
   means for sampling the envelope of the radio frequency signal during successive sampling windows;
   means for storing a weighting function to be applied to the samples;
   means for sensing the part of the window occupied by the envelope; and
   means for adapting the weighting function in the storing means to fit the part of the window unoccupied by the envelope.

15. The apparatus of claim 14 also comprising means for determining whether the envelope occupies a greater part or a lesser part of the window than a threshold value.

16. The apparatus of claim 15 in which the adapting means adapts the weighting function to fit the part of the window unoccupied by the envelope when the envelope occupies a lesser part of the window than the threshold value.

17. The apparatus of claim 16 also comprising means for adapting the weighting function in the storing means to fit the part of the window occupied by the envelope when the envelope occupies a greater part of the window than the threshold value.

18. An apparatus for processing substantially simultaneous radio frequency signals comprising:
   a radio frequency signal receiver to receive said substantially simultaneous radio frequency signals;

a transducer for converting the signals received by said receiver to voltage signals;

an analog to digital converter for converting the voltage signals to digital samples;

a shift register for receiving groups of samples;

an edge detector connected to the shift register for finding leading and trailing signal edges within the group of samples;

a source of weighting functions;

means for selecting a weighting function from the source of weighting functions responsive to edges detected by the edge detector so that the samples within the group of samples which are outside the signal envelope of the detected signal's edge are weighed more than samples within the group of samples which are within the signal envelope of the detected signal edge for at least some edge locations;

means for multiplying the group of samples with the weighting function selected by the means for selecting weighting functions.

19. A method for applying weighting functions to signals comprising;

determining the location of a signal edge within a window of samples;

selecting a weighting function so that when the envelope of the signal, measured form the signal edge is wider than a specified minimum, the envelope is weighted but when the envelope of the signal, measured from the signal edge is narrower than a specified minimum, the sample signal outside the signal envelope is weighted; and applying the selected weighting function to the signals within the window.

* * * * *